April 30, 1957 B. BIRKENES 2,790,856

FREQUENCY SELECTIVE TRANSISTOR AMPLIFIER

Filed Aug. 24, 1953

INVENTOR.
BERNHARD BIRKENES
BY Forman L. Mueller
ATTY.

United States Patent Office 2,790,856

Patented Apr. 30, 1957

2,790,856

FREQUENCY SELECTIVE TRANSISTOR AMPLIFIER

Bernhard Birkenes, Chicago, Ill., assignor to Motorola, Inc., Chicago, Ill., a corporation of Illinois Application August 24, 1953, Serial No. 375,999

2 Claims. (Cl. 179—171)

Figure 1:
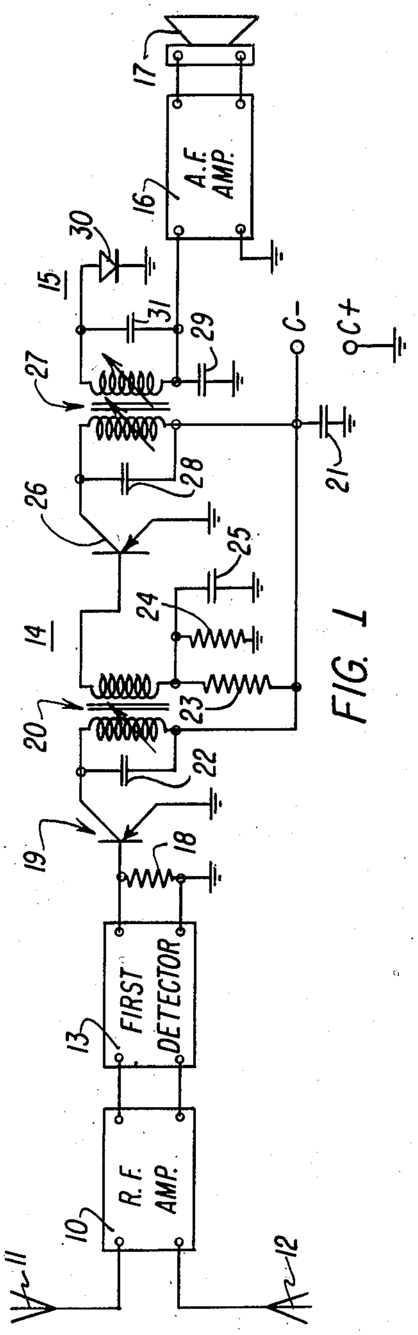

The present invention relates generally to amplifier circuits and more particularly to improved amplifiers using semi-conductors of the type usually referred to as transistors.

Units formed of a semi-conductive material have been developed with three electrodes, usually termed the base, emitter and collector, in contact with faces of the material. Such units exhibit amplifying properties and are therefore suitable for use in amplifier circuits such as are used in radio communication equipment and the like. These semi-conductors are generally referred to as transistors and are of a variety of different types.

Due to the inherent characteristics of transistors, problems have arisen when it is attempted to incorporate such elements in usual amplifier circuits. That is, the usual electron discharge device in an amplifier circuit cannot be replaced by a transistor without additional circuit changes. In order that a transistor may exhibit power gain when used as an amplifier, it must be connected so that its output impedance is considerably higher than its input impedance. This may be achieved, for example, by connecting one of the electrodes of the transistor (for example, the emitter electrode) to ground and biasing the base electrode to such a polarity with respect to the emitter that the transistor has forward conductive characteristics and exhibits relatively low impedance between the emitter and base. Likewise, the collector electrode must be biased with respect to the grounded emitter so that the transistor has reverse conductive characteristics and exhibits relatively high impedance between these latter two electrodes. The input circuit of the transistor then must have an impedance matched to the relatively low impedance of the base emitter portion of the transistor while the output circuit must have an impedance matched to the relatively high impedance between the collector emitter portion of the transistor. This requirement for a relatively low impedance input circuit and relatively high impedance output circuit for a transistor amplifier necessitates circuit changes, as compared with an electron discharge device amplifier in which both the input and output circuits usually have relatively high impedance.

In a usual intermediate frequency amplifier using electron discharge devices, the successive stages of the amplifier are intercoupled by double-tuned resonant networks. These circuits are, in each instance, tuned to the intermediate frequency and present a high impedance input circuit and high impedance output circuit for each stage of the amplifier at that frequency. When a transistor is to be used in an intermediate frequency amplifier, for example, the parallel tuned resonant network is satisfactory in the output circuit of the transistor, but is not satisfactory in the input of the transistor due to its relatively high impedance at the frequency of the signal to be translated.

It is accordingly, an object of the present invention to provide an improved transistor amplifier which is relatively simple in its construction and which exhibits proper characteristics for efficient transistor operation.

A feature of the present invention is the provision of an improved amplifier which incorporates at least one transistor unit and which is constructed in an improved manner to have a low impedance input circuit for the transistor and a high impedance output circuit therefor.

Another feature of the invention is the provision of an improved transistor intermediate frequency amplifier that includes a low impedance untuned input circuit for each of the stages thereof, and a high impedance resonant output circuit for each of the various stages.

Still another feature of the invention is the provision of such an improved intermediate frequency amplifier using a plurality of transistors connected in cascade, and in which the coupling between successive stages is performed by means of a transformer having a tuned primary winding and an untuned secondary winding to provide desired low impedance input circuits and high impedance output circuits fo reach of the transistors.

A still further feature of the invention is the provision of such an improved amplifier circuit which includes at least two transistors connected in cascade, and in which the cascaded stages of the amplifier are intercoupled by means of a transformer having a tuned primary winding connected to the output electrode of one of the transistors and further including a tuned secondary circuit coupled to the primary and serving to preserve selectivity in the amplifier. The input electrodes of the other transistor, instead of being connected directly to the secondary, are inductively coupled thereto through a low impedance untuned inductance coil which preserves the desired low impedance for the input circuit of the latter transistor.

Figure 2:
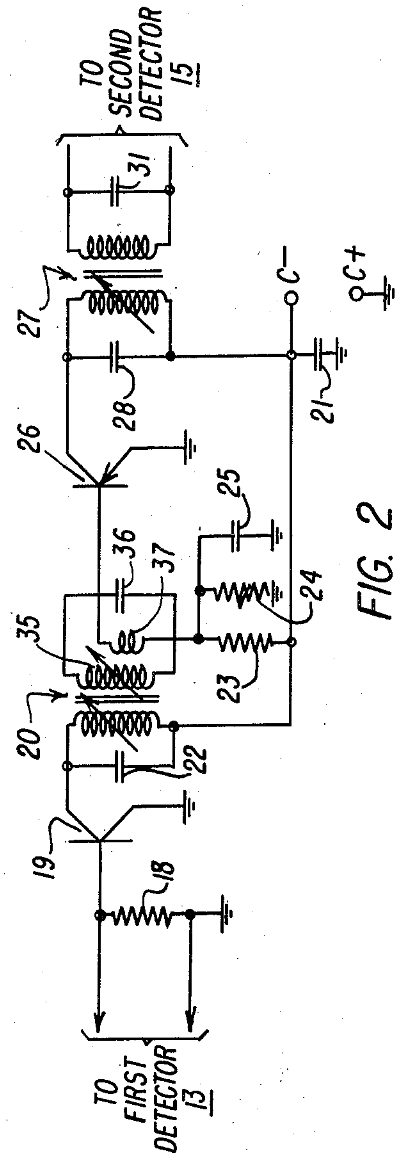

The above and other features of the invention which are believed to be new are set forth with particularity in the appended claims. The invention itself, however, together with further objects and advantages thereof, may best be understood by reference to the following description when taken in conjunction with the accompanying drawing in which:

Figure 1 shows a radio receiver incorporating the improved amplifier of the invention; and Figure 2 is a modification of the invention.

The invention provides an amplifier circuit for translating a signal having a predetermined frequency. The circuit comprises an input circuit including an untuned inductance coil and means for impressing the signal of the predetermined frequency on the inductance coil. A transistor unit is provided which has an input electrode and output electrode and a common electrode. The input electrode and common electrode are coupled across the untuned inductance coil which provides a low impedance input circuit for the transistor. An output circuit including a parallel resonant network tuned to the predetermined frequency is coupled across the output electrode and common electrode of the transistor to provide a high impedance output circuit.

The radio receiver of Figure 1 includes a radio frequency amplifier 10 having input terminals connected to an antenna circuit 11, 12, and output terminals connected to a first detector 13. First detector 13 is coupled through an intermediate frequency amplifier indicated generally as 14 to a second detector 15, the second detector being coupled through an audio frequency amplifier 16 to a sound reproducer 17.

Radio signals intercepted by the antenna 11, 12 are amplified in radio frequency amplifier 10 and heterodyned to the selected intermediate frequency of the receiver in first detector 13. The resulting intermediate frequency signal is amplified in intermediate frequency amplifier 14, detected in second detector 15. The resulting audio signals are amplified in audio amplifier 16 and the sound information reproduced by reproducer 17. The present invention is concerned with the intermediate frequency amplifier 14 and it is to be noted that the amplifier is shown in a radio merely by way of example, and may be used in any circuit in which it is desired to amplify a modulated or unmodulated signal having a selected frequency.

Amplifier 14 includes an input circuit coupled to the output terminals of first detector 13 and comprising a resistor 18 having one side connected to ground and the other to the base electrode of a transistor 19 which constitutes the input electrode for the transistor. The emitter electrode of the transistor is connected to ground and constitutes the common electrode of the transistor, and the collector is connected to the primary winding of an intermediate frequency transformer 20 and forms the output electrode of the transistor. The other side of the primary winding is connected to the negative terminal C— of a biasing potential source whose positive terminal C+ is connected to ground, and this side of the primary winding is bypassed to ground for the intermediate frequency by a capacitor 21. The primary winding is shunted by a capacitor 22, and the capacitor forms, with the primary winding, a parallel resonant circuit tuned to the intermediate frequency. The secondary winding of transformer 20 has one side connected to the common junction of resistors 23 and 24 connected across the biasing source, resistor 24 being bypassed to ground for the intermediate frequency by a capacitor 25. The common junction of resistors 23 and 24 constitutes a second negative biasing source which is less negative than the first source C—.

The other side of the secondary winding of transformer 20 is connected to the base electrode of a transistor 26. The emitter electrode of transistor 26 is connected to ground and the collector electrode is connected to one side of the primary winding of a coupling transformer 27. The other side of the primary winding of transformer 27 is connected to the first negative biasing source C—, and this winding is shunted by a capacitor 28 which constitutes therewith a parallel resonant circuit tuned to the intermediate frequency.

The secondary winding of transformer 27 has one side bypassed to ground for the intermediate frequency through a capacitor 29 and has its other side connected through a rectifier 30 to ground. The secondary winding of transformer 27 is shunted by a capacitor 31 that constitutes a parallel resonant circuit therewith tuned to the intermediate frequency.

As previously stated, it is essential for the proper operation of a transistor as an amplifier that it have a relatively low impedance input circuit and relatively high impedance output circuit. In amplifier 14, transistor 19 is biased by the first biasing source C— to exhibit the desired amplifier characteristics. A low impedance input circuit is provided for the transistor by resistor 18, and a high impedance output circuit is provided therefor at the intermediate frequency by virtue of the parallel-resonant circuit formed by capacitor 22 and the primary winding of transformer 20. In this manner, transistor 19 exhibits amplifying characteristics at the intermediate frequency, and the intermediate frequency signal from detector 13 is amplified and applied thereby to transformer 20.

The secondary winding of transformer 20 is untuned so as to provide a low impedance input circuit for transistor 26. The emitter of transistor 26 is grounded, the collector electrode is biased to a selected negative value with respect to reference or ground by the first biasing source C—, and the base is biased to a less negative value by the second biasing source formed at the junction of resistors 23 and 24. The transistor is therefore biased to perform its amplifying function, and has a low impedance input circuit provided by the untuned inductance coil formed by the secondary winding of transformer 20. Moreover, a high impedance output circuit is provided for the transistor 26 at the intermediate frequency by the parallel resonant circuit of capacitor 28 and the primary winding of transformer 27.

As an illustrative example only, the input circuit formed by the secondary winding of transformer 20 may have an impedance of the order of 200 to 600 ohms; whereas the output impedance formed by the last mentioned parallel resonant circuit at the intermediate frequency may be of the order of 20,000 ohms to 1 megohm. In a constructed embodiment of the invention, it was found that the amplifier operated with a high degree of efficiency and with no appreciable loss in selectivity due to the fact that the secondary winding of transformer 20 is untuned. It is noted that in the disclosed embodiment, the transistors have their emitter electrodes grounded. However, as is well known, the transistors could be connected with their base electrodes grounded and their emitters connected to the input circuits.

When it is desired to preserve high selectivity in the receiver, the modified arrangement of Figure 2 can be used. The latter circuit is similar to that of Figure 1 with the exception that the untuned inductance coil in the input circuit of transistor 26, instead of being coupled directly to the primary winding of transformer 20, is effectively coupled thereto through a secondary winding 35. Winding 35 is shunted by a capacitor 36 which tunes the winding to the intermediate frequency. In this manner, the transformer 20 exhibits the desired double-tuned high selectivity charatceristics, and yet a low impedance circuit for transistor 26 is provided by the inductance coil 37 which is inductively coupled to winding 35, coil 37 being connected to the transistor in the same manner as the secondary winding of transformer 20 in the embodiment of Figure 1.

The invention provides, therefore, an improved amplifier circuit in which the superior characteristics of transistor units are utilized, and in which the simplicity of the circuit is otherwise maintained.

While preferred embodiments of the invention have been shown and described, modifications may be made and it is intended in the appended claims to cover all such modifications as fall within the true spirit and scope of the invention.

I claim:

1. A frequency selective amplifier circuit for translating a signal having a predetermined frequency, said circuit including in combination, a coupling transformer having a primary winding and a secondary winding inductively coupled one to the other, a tuning capacitor shunting said primary winding to constitute therewith a parallel-resonant circuit tuned to the predetermined frequency, means for impressing the aforesaid signal across said resonant circuit; a tuning capacitor shunting said secondary winding to constitute therewith a parallel-resonant circuit of relatively high impedance tuned to the predetermined frequency; an untuned inductance coil inductively coupled to said secondary winding; a transistor unit having an input electrode, an output electrode and a common electrode; means for coupling said input electrode and said common electrode across said untuned inductance coil; said inductance coil having a relatively low impedance to match the input of said transistor unit for optimum signal input thereto; and an output network including means for coupling signals from said output electrode and common electrode of said transistor unit.

2. An amplifier circuit for translating a signal having a predetermined frequency, said circuit including in combination, a first transistor unit including first, second and third electrodes, with said first electrode being connected to a point of reference potential; means for impressing the aforementioned signal on said second electrode; a coupling transformer including a primary winding and a secondary winding, said primary winding having one side connected to a source of biasing potential and its other side connected to said third electrode; a pair of capacitors respectively shunting said primary and secondary windings to constitute therewith respective resonant circuits of relatively high impedance tuned to the predetermined frequency; an untuned inductance coil of relatively low impedance inductively coupled to said secondary winding and having one side connected to a source of biasing potential; a second transistor unit including first, second and third electrodes, with said first electrode thereof being connected to said point of reference potential and with said second electrode thereof being connected to the other side of said untuned inductance coil; the low impedance of said inductive coil serving as an impedance match for said first and second elements of said transistor; and an output network including a parallel resonant circuit tuned to the predetermined frequency, one side of said last mentioned parallel resonant circuit being connected to said third electrode of said second transistor and the other side thereof being connected to a source of biasing potential.

References Cited in the file of this patent

UNITED STATES PATENTS

| | | |
|---|---|---|
| 1,467,596 | Wold | Sept. 11, 1923 |
| 1,537,528 | Ehret | May 12, 1925 |
| 2,647,957 | Mallinckrodt | Aug. 4, 1953 |
| 2,647,958 | Barney | Aug. 4, 1953 |
| 2,691,074 | Eberhard | Oct. 5, 1954 |